(12) United States Patent
Kloska et al.

(10) Patent No.: US 8,026,780 B2
(45) Date of Patent: Sep. 27, 2011

(54) RESONATOR FILTER WORKING WITH SURFACE ACOUSTIC WAVES

(75) Inventors: Gerhard Kloska, Rosenheim (DE); Armin Schober, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/551,100

(22) Filed: Aug. 31, 2009

(65) Prior Publication Data

US 2010/0045397 A1 Feb. 25, 2010

Related U.S. Application Data

(63) Continuation of application No. PCT/EP2008/052317, filed on Feb. 26, 2008.

(30) Foreign Application Priority Data

Mar. 1, 2007 (DE) .......................... 10 2007 010 040

(51) Int. Cl.
*H03H 9/64* (2006.01)

(52) U.S. Cl. ....................................... 333/193; 333/195

(58) Field of Classification Search .......... 333/193–196; 310/313 R–313 D
See application file for complete search history.

(56) References Cited

U.S. PATENT DOCUMENTS

| 5,666,092 A | 9/1997 | Yamamoto et al. |
| 5,986,524 A | 11/1999 | Shimoe |
| 6,023,122 A | 2/2000 | Liu et al. |
| 6,032,122 A | 2/2000 | Gertner et al. |
| 6,163,236 A | 12/2000 | Thomas |
| 6,476,691 B1 * | 11/2002 | Tsuzuki et al. ................ 333/193 |
| 6,650,206 B2 * | 11/2003 | Nakamura et al. ............ 333/193 |
| 6,906,602 B2 | 6/2005 | Kidoh |
| 2004/0233018 A1 | 11/2004 | Watanabe et al. |

FOREIGN PATENT DOCUMENTS

| DE | 197 53 664 B4 | 7/1998 |
| DE | 103 58 347 B4 | 8/2004 |
| EP | 0 266 372 B1 | 6/1987 |
| EP | 0 545 672 B1 | 6/1993 |
| EP | 0 927 456 B1 | 7/1999 |
| EP | 1 249 934 A2 | 10/2002 |
| EP | 1 289 135 A2 | 3/2003 |
| EP | 1 337 039 B1 | 8/2003 |
| JP | 06-334475 A | 12/1994 |

OTHER PUBLICATIONS

Avramov, I. D., "Very Wide Tuning Range, Low-Noise Voltage Controlled Oscillation Using Ladder Type Leaky Surface Acoustic Wave Filters," 1998 IEEE International Frequency Control Symposium, pp. 489-496, IEEE.

Meltaus, J., et al., "SAW Filters Based on Parallel—Connected Coupled Resonator Filters with Offset Frequencies," IEEE Transactions on Ultrasonics, Frerroelectronics, and Frequency Control, vol. 54, No. 1, Jan. 2007, pp. 167-176, IEEE.

* cited by examiner

*Primary Examiner* — Robert Pascal
*Assistant Examiner* — Alan Wong
(74) *Attorney, Agent, or Firm* — Slater & Matsil, L.L.P.

(57) ABSTRACT

A resonator filter working with surface acoustic waves is disclosed. The transfer function of this filter features a phase rotation of at least 400° within a passband.

25 Claims, 14 Drawing Sheets

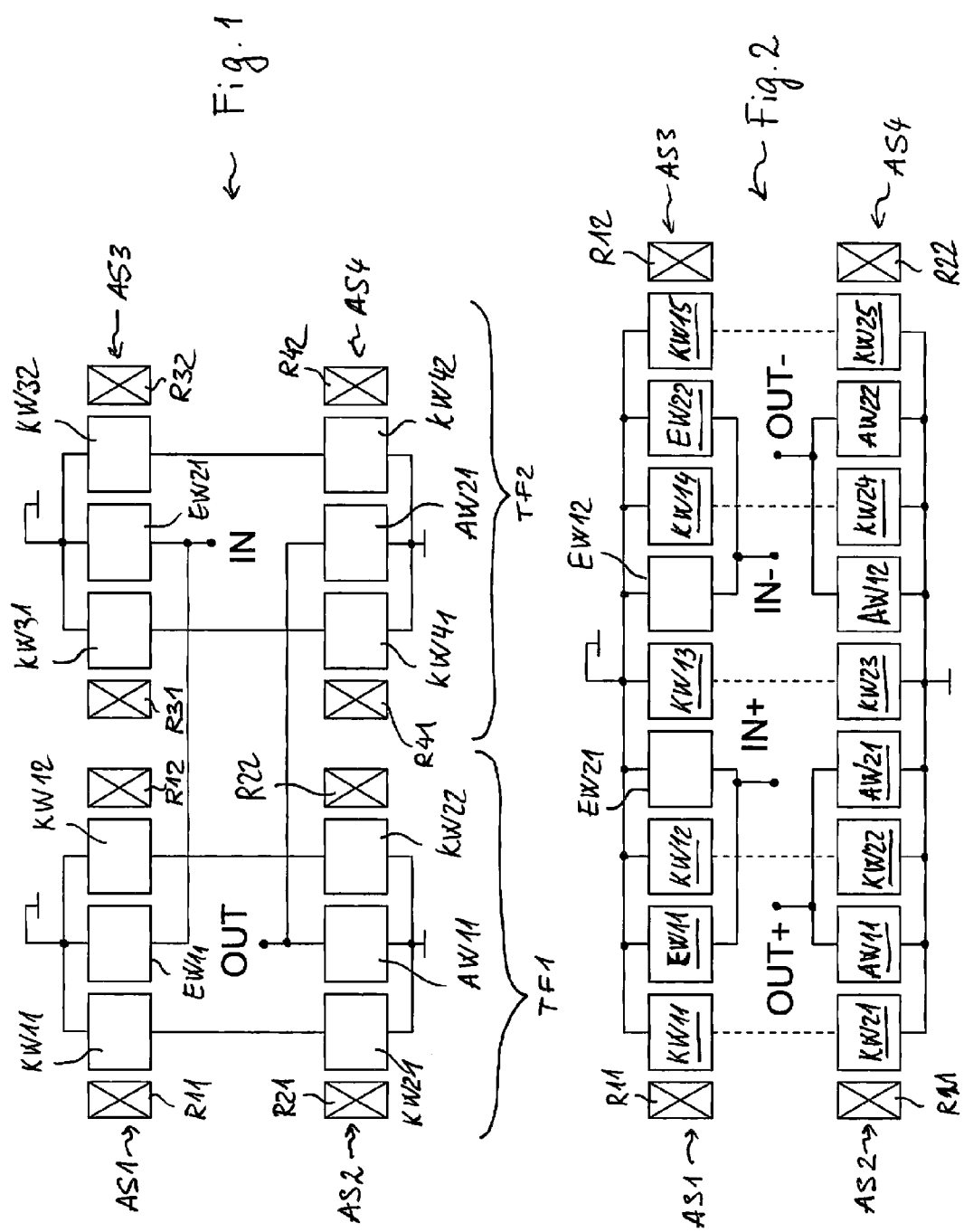

RESONATOR FILTER WORKING WITH SURFACE ACOUSTIC WAVES

This application is a continuation of co-pending International Application No. PCT/EP2008/052317, filed Feb. 26, 2008, which designated the United States and was not published in English, and which claims priority to German Application No. 10 2007 010 040.1 filed Mar. 1, 2007, both of which applications are incorporated herein by reference.

BACKGROUND

Surface acoustic wave filters are known from the publications EP 0545672 A1, EP 0927456 B1, US 2004/233018 A1, and U.S. Pat. No. 6,163,236.

SUMMARY

In one aspect, the invention provides a resonator filter working with surface acoustic waves with a high bandwidth.

A resonator filter working with surface acoustic waves will be disclosed whose transfer function features a phase rotation of at least 400° within a passband. In one embodiment, the transfer function features a phase rotation of at least 540° within the passband. In one advantageous embodiment, a phase rotation of 720°±20° is achieved within the resonator filter.

Such a large phase rotation could be achieved, for example, by a parallel circuit of at least two sub-filters with passbands shifted relative to each other.

In this way, it is possible to realize SAW filters with a relative bandwidth of at least 8% with respect to the center of the passband for low insertion loss, low amplitude ripple and group delay ripple, and also high selection in the stop bands. In one embodiment, the selection equals at least 40 dB. In one embodiment, the maximum insertion loss in the passband is 7.5 dB.

All information in dB refers to the maximum amplitude of the corresponding filter characteristics or transfer function $S_{21}$. The phase rotation is to be understood as $\arg\{S_{21}\}$, i.e., the phase response of $S_{21}$.

The resonator filter is used, for example, downstage of the first mixer in receivers or systems, for fast data transfer of at least 100 Mpbs/s. The resonator filter preferably operates in the range of intermediate frequencies, e.g., between 500 MHz and 2 GHz, and in one embodiment at 1280 MHz. With the disclosed filter it is possible to achieve a bandwidth of at least 100 MHz at −3 dB at this frequency.

The resonator filter is preferably constructed as a DMS filter. DMS stands for Double Mode Surface Acoustic Wave.

The resonator filter has at least one acoustic track. The resonator filter preferably has at least three terminal transducers. An input transducer or an output transducer is designated as a terminal transducer.

At least one terminal transducer and at least two coupler transducers are arranged in the corresponding acoustic track. The terminal transducers and the coupler transducers are arranged in an alternating pattern. Each terminal transducer is preferably arranged between two coupler transducers. In one advantageous embodiment, each acoustic track contains two terminal transducers and three coupler transducers.

In one embodiment, the three or more terminal transducers comprise at least two input transducers conductively interconnected, and at least one output transducer or at least one input transducer and at least two output transducers conductively interconnected. The one or more input transducers are connected to an input gate and the one or more output transducers are connected to an output gate. The gates can each be both balanced/differential and unbalanced/single-ended. At least one gate or both gates can be balanced or unbalanced.

The resonator filter preferably has at least two sub-filters electrically interconnected. The transfer functions of the two sub-filters overlap to form the transfer function of the entire filter. Each sub-filter preferably has at least one separate input transducer and/or output transducer that is conductively connected to at least one input transducer or output transducer of another sub-filter. In principle, the sub-filters could also have a common input or output transducer.

The sub-filters could be realized in separate acoustic tracks. The sub-filters could also be realized in at least one common acoustic track. For example, it is possible to realize both sub-filters in a single track with seven transducers, amongst these, three terminal transducers and four coupler transducers.

The sub-filters could feature at least one common terminal transducer.

The resonator filter preferably has at least two acoustic tracks, among these, one track with at least one input transducer and one other track with at least one output transducer. In one embodiment, the resonator filter features at least two acoustic tracks, each with at least one input transducer, and at least two other acoustic tracks, each with at least one output transducer.

One electroacoustic transducer preferably comprises electrode strips that are arranged on a periodic grid and that are also designated as fingers. The fingers of a first polarity are connected to a first common electrode and the fingers of a second polarity are connected to a second common electrode. The fingers of different polarities are preferably arranged in an alternating sequence. The fingers extend preferably perpendicular to the direction of propagation of the surface acoustic wave excited in the transducer by an electrical signal.

In one advantageous embodiment, each acoustic track is bounded on two sides by acoustic reflectors. Each acoustic track preferably represents one DMS track.

In one embodiment, each acoustic track that has at least one input transducer connected to the input of the filter is acoustically and/or galvanically decoupled from the output of the filter. This means that there are no output transducers connected to the output of the filter in this track.

In one embodiment, the acoustic track that has at least one output transducer connected to the output of the filter is acoustically and/or galvanically decoupled from the input of the filter. This means that there are no input transducers connected to the input of the filter in this track.

The tracks can be electrically interconnected. Each track preferably has at least three electroacoustic transducers that are arranged one next to the other and that are acoustically coupled to each other. In one embodiment, each track has at least one coupler transducer whose one collection rail is connected to ground and whose other collection rail is conductively connected to a coupler transducer of another track. Preferably, an acoustic track that has at least one input transducer is connected by means of coupler transducers to another acoustic track that has at least one output transducer.

Each input transducer is preferably arranged between two coupler transducers. Each output transducer is preferably arranged between two coupler transducers.

In one embodiment, a coupler transducer is arranged between two input transducers arranged in an acoustic track. In one embodiment, a coupler transducer is arranged between two output transducers arranged in an acoustic track.

In one advantageous embodiment, each acoustic track has at least five electroacoustic transducers acoustically coupled to each other. Here, three of the transducers preferably represent coupler transducers.

In one embodiment, the resonator filter has at least two first input transducers that are conductively interconnected and at least two first output transducers that are conductively interconnected. The first input transducers are preferably connected in parallel. The first output transducers are preferably connected in parallel. However, there is the possibility of connecting the first input transducers or the first output transducers in series.

Each of the transducers interconnected in parallel could be arranged in different acoustic tracks, wherein they are acoustically decoupled from each other. The transducers interconnected in parallel could be arranged in one and the same acoustic track, wherein they are acoustically coupled to each other.

In one embodiment, the filter features an unbalanced input gate and an unbalanced output gate. At least one of the gates, however, could also have a balanced configuration. In one embodiment, the filter features a balanced input gate and an unbalanced output gate, or vice versa.

In one embodiment, the filter features a balanced input gate and a balanced output gate. The filter here also has at least two second input transducers and at least two second output transducers. The second input transducers are preferably connected in parallel. The second output transducers are preferably connected in parallel. However, there is the possibility of connecting the second input transducers or the second output transducers in series.

In one embodiment, it is possible to connect the series circuit of the first input transducers in series with the series circuit of the second input transducers and to arrange it between the first and second terminals of the input gate. In addition, it is possible to connect the series circuit of the first output transducer in series with the series circuit of the second output transducers and to arrange it between the first and second terminals of the output gate.

In another embodiment it is possible to connect the parallel circuit of the first input transducers in series with the parallel circuit of the second input transducers and to arrange it between the first and second terminals of the input gate. In addition, it is possible to connect the parallel circuit of the first output transducers in series with the parallel circuit of the second output transducers and to arrange it between the first and second terminals of the output gate.

The first input transducers are connected to a first terminal of the input gate and the second input transducers are connected to a second terminal of the balanced input gate.

The first output transducers are connected to a first terminal of the output gate and the second output transducers are connected to a second terminal of the balanced output gate.

At least two of the first input transducers connected in parallel could be arranged within one acoustic track. Also, at least two of the second input transducers connected in parallel could be arranged within one acoustic track. In one embodiment, the first input transducers and the second input transducers are arranged in separate tracks. In one embodiment, the first input transducers are arranged in the first sub-filter and the second input transducers are arranged in the second sub-filter. This applies analogously also to the first output transducers and the second output transducers.

For example, the first input transducers are arranged in the first track and the first output transducers are arranged in the second track of the first sub-filter, wherein the second input transducers are arranged in the first track and the second output transducers are arranged in the second track of the second sub-filter.

In one embodiment, the resonator filter has a first sub-filter and a second sub-filter that are electrically interconnected. Each sub-filter has a passband that is narrower than the passband of the resonator filter. In one embodiment, the resonator filter could also feature more than only two sub-filters that are preferably interconnected and that are connected preferably in parallel.

Each sub-filter preferably represents a DMS filter. Preferably, at least two similar DMS filters are connected in parallel for forming the resonator filter.

Each sub-filter preferably features a first acoustic track and a second acoustic track electrically connected to this first track. The first track preferably has input transducers and the second track has output transducers.

In each sub-filter, a phase rotation of at least 200° is generated across half the passband of the resonator filter. A phase rotation of at least 400° is generated within the resonator filter. In one advantageous embodiment, a phase rotation of at least 300° is achieved in each sub-filter and, overall, a phase rotation of at least 600° is achieved.

In another advantageous embodiment, a rotation of 360°±10° is generated in each sub-filter preferably across half the passband of the resonator filter. In this way, it is achieved that the signals of both sub-filters are in phase in a frequency range preferably arranged in the center of the passband of the resonator filter. A phase rotation of 720°±20° is achieved within the resonator filter.

The phase coincidence has the advantage that, especially in a transition or overlapping range between the passbands of the sub-filters, phase jumps can be avoided at this position. Thus, a flat frequency response of the group delay or an especially small ripple of the frequency response of the group delay can be achieved.

The passbands of the two sub-filters defined at a given level, e.g., −3 dB, −4 dB, −6 dB, or −8 dB, can feature an overlapping range. The passbands of the two sub-filters could also be spaced apart from each other by a transition range. Even if each sub-filter does not have a smooth passband, it is possible to achieve a wide passband of the resonator filter with a small ripple through the parallel circuit and the optimization of geometric parameters of the transducers arranged in the sub-filters.

The sub-filters are preferably operated in-phase. This means that a phase relationship that is given in the first sub-filter between the input signal and the output signal is also given in the second sub-filter. This also means that a second sub-filter could be generated from a first sub-filter without changing a phase relationship. A phase relationship is understood to be at least one property selected from the following: the finger parity, the arrangement and the orientation of the transducers, the polarity of the input or output signals.

Each sub-filter preferably has at least one input transducer and also at least one output transducer. The one or more input transducers are preferably arranged in the first acoustic track and the one or more output transducers are arranged in the second acoustic track of each sub-filter.

In one advantageous embodiment, at least one of the first input transducers and at least one of the second input transducers are arranged in the first track of each sub-filter. In this way, in the second track of each sub-filter there is at least one of the first output transducers and at least one of the second output transducers.

The first sub-filter and the second sub-filter are preferably connected in parallel. This means that at least one transducer of the first sub-filter is connected in parallel to at least one transducer of the second sub-filter. In one advantageous embodiment, one of each of the transducers interconnected in parallel is arranged in the first sub-filter and the other transducer is arranged in the second sub-filter. This applies especially to the input transducers and the output transducers.

The first input transducer arranged in the first sub-filter is preferably connected in parallel with the first input transducer arranged in the second sub-filter and connected to the first terminal of the input gate. The second input transducer arranged in the first sub-filter is preferably connected in parallel with the second input transducer arranged in the second sub-filter and connected to the second terminal of the input gate. This applies preferably in a corresponding way also to the first and second output transducers and the first and second terminals, respectively, of the output gate.

In one embodiment, the passband of the first sub-filter lies at least partially outside of the passband of the second sub-filter, or vice versa. The boundaries of each passband are defined for a given level of, e.g., −3 dB, −4 dB, −6 dB, −8 dB, or a different level.

At least one part of a stop band of the first and/or second sub-filter lies preferably in the passband of the resonator filter. As the stop band of a circuit, a frequency range is designated that lies outside of the passband of this circuit. In one embodiment, as the stop band, a frequency band is designated in which the signal suppression equals at least 20 dB.

Each sub-filter preferably has an input-side track and an output-side track that are conductively interconnected. The tracks of the sub-filters facing the input preferably feature the same topology. The tracks of the sub-filters facing the output preferably feature the same topology. The topology of each track is understood to be, primarily, the number and relative arrangement of transducers within this track. The relative arrangement comprises a defined phase relationship between two transducers, that is, specifically, between two successive transducers.

The sub-filters could also have a "mirrored" topology. In this case, the reference numbers of the transducers reverse at the transition from the first sub-filter to the second sub-filter. For example, in the first sub-filter, counting is from left to right, and in the second sub-filter from right to left. Here, preferably the input and output transducers are respectively interconnected in parallel with the same reference numbers. So that the phase relationships are maintained for the mirrored arrangement of transducers, each track is mirrored in the two sub-filters. According to the mirroring, at least one geometric parameter can be changed in one of each of the corresponding transducers.

Corresponding transducers are designated, e.g., as transducers that have the same reference number but that are arranged in different sub-filters. Corresponding transducers are also designated as those transducers with the same reference number arranged in different tracks of each sub-filter.

In one embodiment, the corresponding transducers feature a different number of fingers. Here, the parity in the number of fingers in the two transducers is preferably identical, i.e., the number of fingers is either even or odd in both cases. In principle, this configuration can be deviated from as long as all of the phase relationships for both tracks are maintained by a corresponding adaptation of the other transducers.

Under certain circumstances, the corresponding transducers that are arranged in different sub-filters could differ in at least one of the following geometric parameters: distance between the electrodes (pitch), aperture (i.e., the transverse width of an acoustically active area of the track), number of electrode fingers, degree of metallization (i.e., the ratio of the metalized surface area to the total surface area within the acoustically active area of the track). Corresponding transducers that are arranged in different sub-filters, however, could also be constructed identically with respect to at least one of the geometric parameters.

An input-side track and an output-side track of each sub-filter will be considered. Corresponding transducers, e.g., transducers with the same reference number, could be constructed differently with respect to at least one of the geometric parameters. They could also have different numbers of fingers as long as all of the phase relationships for both tracks are maintained.

In one embodiment, the input-side track of the first and the second sub-filters are essentially equal, at least with respect to the number of fingers and the phase of the transducers corresponding to each other with respect to reference number. The output-side tracks of the first and second sub-filters are also essentially equal in a corresponding way.

In one embodiment, the input-side track of the second sub-filter is essentially mirror-symmetric to the track of the first sub-filter facing the input, at least with respect to the phase of the corresponding transducers. The track of the second sub-filter facing the output is correspondingly also essentially mirror-symmetric to the track of the first sub-filter facing the output.

The track facing the input has at least one coupler transducer that is conductively connected, in one embodiment, to at least one coupler transducer of the track of each sub-filter facing the output. These coupler transducers form a transducer pair.

In one embodiment, each acoustic track has at least three coupler transducers. Between every two coupler transducers there is one transducer, selected from the first input transducers, the second input transducers, the first output transducers, and the second output transducers.

The coupler transducers preferably represent terminal transducers of each track. In one embodiment, however, input transducers and/or output transducers could also be provided as first or last transducers of the corresponding track.

In one embodiment, the corresponding acoustic track has at least two coupler transducers that are electrically connected in parallel. In one embodiment, the corresponding acoustic track has at least three coupler transducers that are electrically connected in parallel. The coupler transducers that are arranged in different sub-filters could also be conductively interconnected, in one embodiment electrically in parallel. This applies preferably to facing common electrodes of the coupler transducers, wherein these electrodes do not lie at ground.

In one embodiment, at least two coupler transducers arranged in the input-side track of the corresponding sub-filter are operated out-of-phase, wherein, preferably, the corresponding coupler transducers arranged in the output-side track of this sub-filter are also operated out of phase.

In one embodiment, the output-side track of each sub-filter could be generated by mirroring the input-side track of this filter about a longitudinal axis. The longitudinal axis is directed parallel to the direction of wave propagation. According to the mirroring, it is possible to change at least one of the geometric parameters. It is also possible to change the number of fingers in individual transducers of the output-side track, as long as the phase relationship between the input and output signals is maintained.

The coupler transducers preferably serve for coupling an input-side track and an output-side track of the same sub-filter.

In one embodiment, the resonator filter comprises a first matching network that is connected between the input gate and the input-side acoustic track of the filter and/or a second matching network that is connected between the output gate and the output-side acoustic track of the filter.

Each matching network is used for matching the input impedance or the output impedance of the resonator filter to the given reference impedance, such as, e.g., 50 Ohm. In one embodiment, each matching network comprises at least one element selected from a parallel inductor, a parallel capacitor, a series inductor, a series capacitor, and a line section. The series-L or series-C is arranged in a series branch of the filter and the parallel-L or parallel-C is arranged in a transverse branch of the filter.

As a corresponding alternative to a parallel circuit, e.g., input-side tracks of the sub-filter could be interconnected in series. Here, at least one input transducer of the input-side track of the first sub-filter is connected in series with at least one input transducer of the input-side track of the second sub-filter.

Output-side tracks of the sub-filters could also be interconnected in series. At least one output transducer of the output-side track of the first sub-filter is here connected in series with at least one output transducer of the output-side track of the second sub-filter.

According to one advantageous embodiment, both sub-filters have at least one common transducer, selected from an input transducer and an output transducer, or at least one common track, selected from an input-side track and an output-side track.

In one embodiment, the sub-filters have a common input track and each has a separate output track, wherein it is understood that the input and output are interchangeable. In this case, instead of four acoustic tracks, only three tracks are provided. The tracks are interconnected as before, via coupler transducers.

In another embodiment, the sub-filters have a common input track and also a common output track. In this case, instead of four acoustic tracks, only two tracks are provided.

In principle, two tracks running parallel to each other could be replaced with one acoustic track or one in-line arrangement of tracks. Here, the transducers of the two tracks are arranged one next to the other within a common track or, in the inline arrangement, the tracks. Two tracks arranged adjacent to another could have a common reflector. There is also the possibility of coupling the tracks acoustically to each other through an acoustic, partially transmissive reflector.

The common acoustic track is produced from an in-line arrangement by leaving out the inner reflector. In this case, the two, now adjacent, inner coupler transducers could be replaced by a common coupler transducer. Here, attention is paid to the correct phase relationship at the interface. If one starts from an embodiment with two tracks each having three transducers, after combining these tracks, one obtains an acoustic track with five transducers, amongst these three coupler transducers, at least one input transducer, and/or at least one output transducer. In one embodiment, a first transducer that is arranged between two coupler transducers is provided as an input transducer and a second transducer that is arranged between two coupler transducers is provided as an output transducer. In another embodiment, both transducers arranged between the coupler transducers are provided either as input transducers or as output transducers. Two input transducers or output transducers could be connected in parallel or in series.

In a corresponding way, combining three three-transducer tracks leads to a seven-transducer track with three transducers, amongst these, at least one input transducer and at least one output transducer.

At least three terminal transducers, selected from input transducers and output transducers, are advantageous for achieving a large phase rotation.

BRIEF DESCRIPTION OF THE DRAWINGS

The specified component and its advantageous configurations will be explained below with reference to schematic figures that are not true-to-scale.

FIG. 1, shows a resonator filter with two sub-filters, unbalanced input and unbalanced output;

FIG. 2, shows another resonator filter with two sub-filters, a balanced input and a balanced output;

Figure 3:
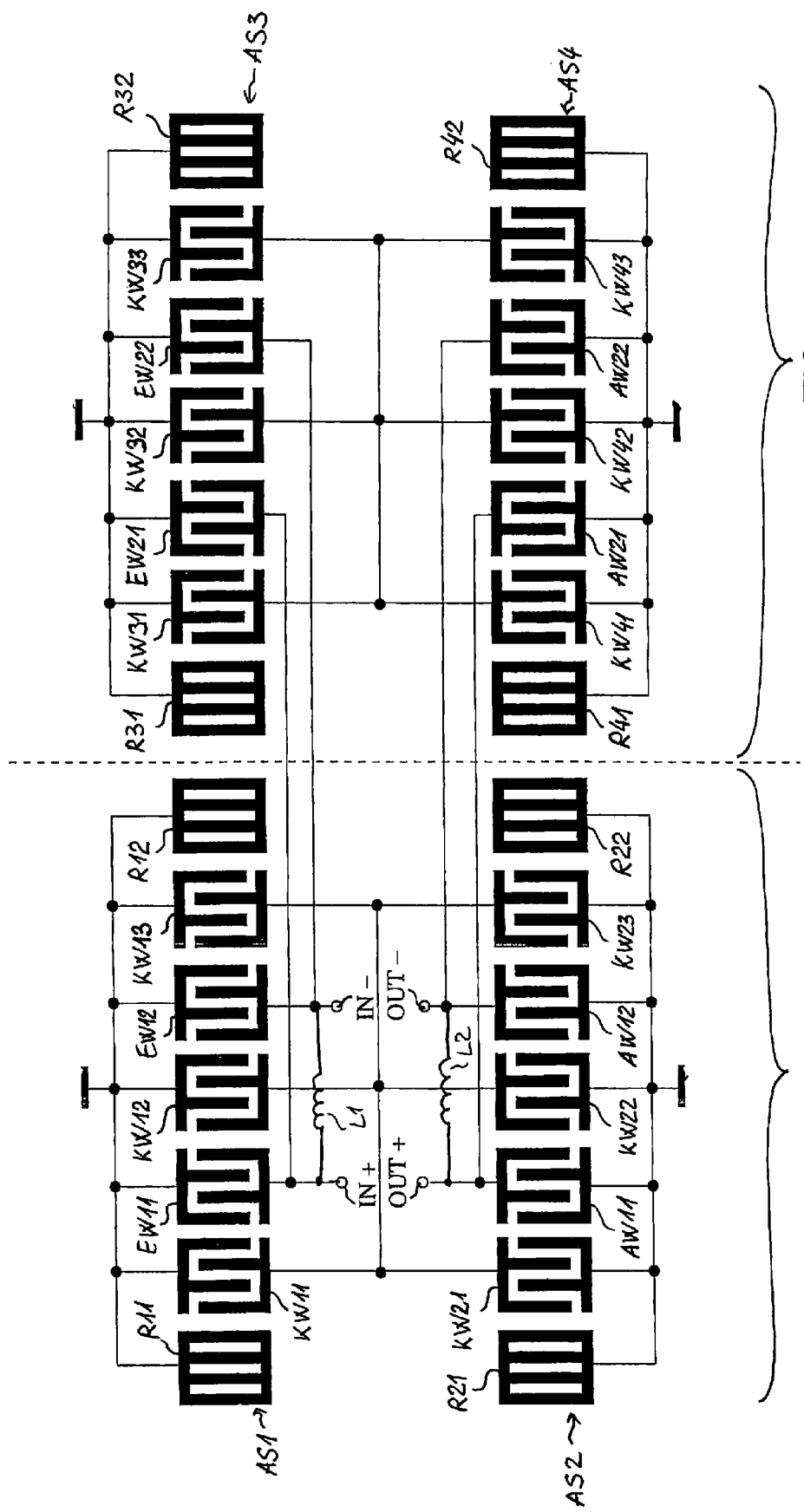
FIGS. 3, 4, each show a resonator filter with two sub-filters that each have two tracks with five transducers.

The following list of reference symbols may be used in conjunction with the drawings:

AS1, AS2, AS3, AS4 Acoustic track
EW11, EW12, EW21, EW22 Input transducer
AW11, AW12, AW21, AW22 Output transducer
IN, IN+, IN− Terminals of the input gate
KW11, KW12, KW13, KW14, KW15 Coupler transducer
KW21, KW22, KW23, KW24, KW25 Coupler transducer
KW31, KW32, KW33 Coupler transducer
KW41, KW42, KW43 Coupler transducer
L1, L2 Parallel inductor
OUT, OUT+, OUT− Terminals of the output gate
R11, R12, R21, R22 Reflector
R31, R32, R41, R42 Reflector
SA Axis of symmetry
TF1 First sub-filter
TF2 Second sub-filter
51 Magnitude of transfer function $S_{21}$ for first sub-filter
52 Phase response of transfer function $S_{21}$ for first sub-filter
61 Magnitude of transfer function $S_{21}$ for second sub-filter

62 Phase response of transfer function $S_{21}$ for second sub-filter

71 Magnitude of transfer function $S_{21}$ for resonator filter

72 Phase response of transfer function $S_{21}$ for resonator filter

81 Frequency response of group delay time

DETAILED DESCRIPTION OF ILLUSTRATIVE EMBODIMENTS

In FIG. 1, a resonator filter is shown with an unbalanced input gate IN and an unbalanced output gate OUT. The resonator filter has a first sub-filter TF1 and a second sub-filter TF2. The first sub-filter TF1 comprises a first acoustic track AS1 that is bounded by reflectors R11 and R12 and a second acoustic track AS2 that is bounded by reflectors R21 and R22. The second sub-filter TF2 comprises a first acoustic track AS3 that is bounded by reflectors R31 and R32 and a second acoustic track AS4 that is bounded by reflectors R41 and R42.

The track AS1 comprises coupler transducers KW11, KW12 and an input transducer EW11 arranged between the coupler transducers. The track AS3 comprises coupler transducers KW31, KW32 and an input transducer EW21 arranged between the coupler transducers. The input transducers EW11, EW21 are connected in parallel and to a terminal of the input gate IN.

The track AS2 comprises coupler transducers KW21, KW22 and an output transducer AW11 arranged between the coupler transducers. The track AS4 comprises coupler transducers KW41, KW42 and an output transducer AW21 arranged between the coupler transducers. The output transducers AW11, AW21 are connected in parallel and to a terminal of the output gate OUT.

The tracks AS1, AS3 are electrically connected to the tracks AS2, AS4 and to the output of the filter.

The coupler transducers KW11 and KW21 of the tracks AS1, AS2 are connected in series. The coupler transducers KW12 and KW22 are also connected in series. The coupler transducers KW31 and KW41 of the tracks AS3, AS4 are connected in series. The coupler transducers KW32 and KW42 are also connected in series. The coupler transducers KW21, KW22, KW41, KW42 are used for coupling the electrical signal generated in the coupler transducers KW11, KW12, KW31, KW32 into the output-side track AS2, AS4 of the corresponding sub-filter TF1, TF2.

Figure 4:
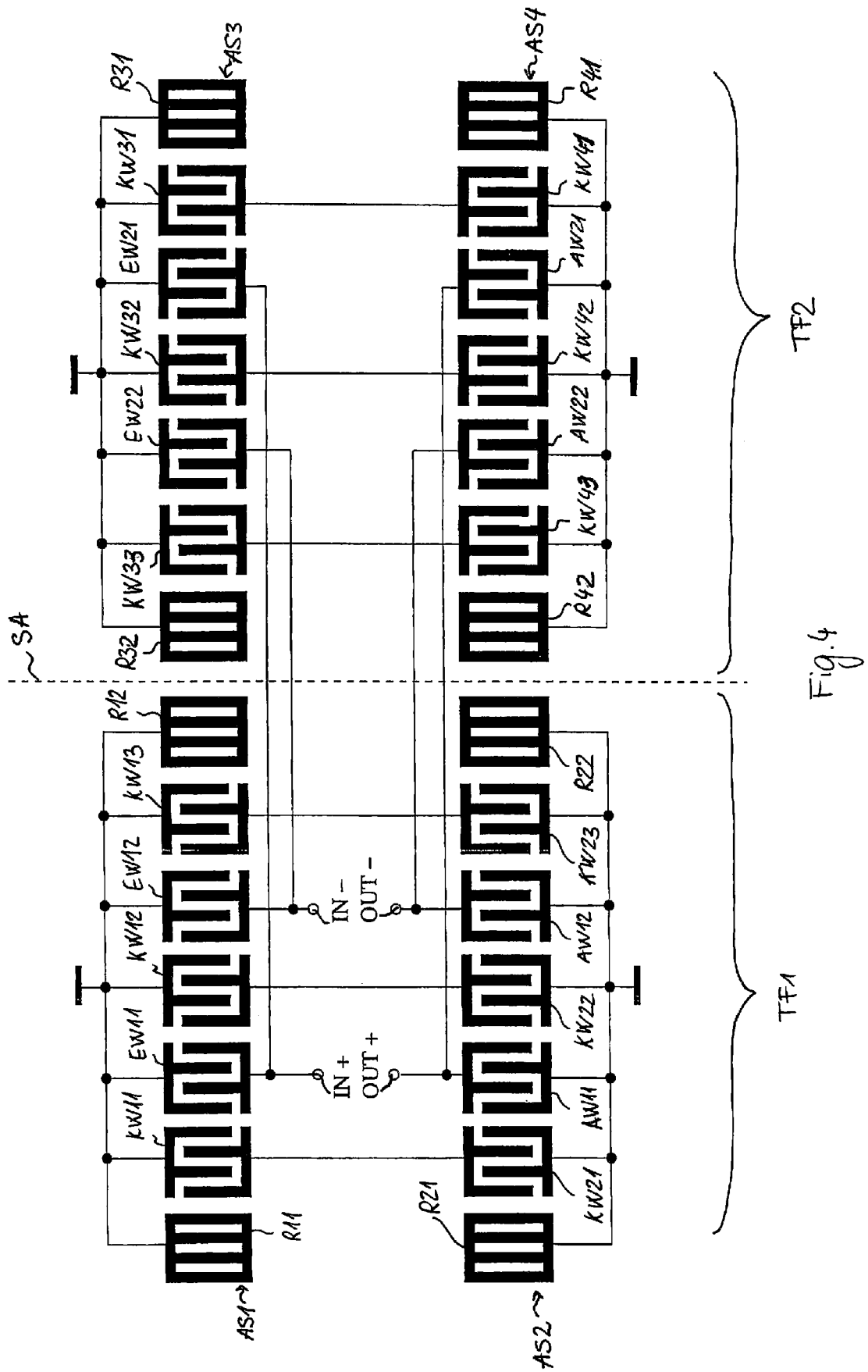

The resonator filter presented in FIG. 1 has four acoustic tracks each with three transducers. In FIGS. 3 and 4, additional resonator filters are shown that have four acoustic tracks, each with five transducers.

The resonator filter presented in FIG. 2 has two acoustic tracks AS1, AS2, each with nine transducers. The filter has two balanced electrical gates. The balanced input gate has a first terminal IN+ and a second terminal IN−. The balanced output gate has a first terminal OUT+ and a second terminal OUT−. In the unbalanced configuration, the terminals IN− and OUT− are connected to ground.

In this case, in the track AS1 there are two first input transducers EW11, EW21 connected in parallel and two second input transducers EW12, EW22 also connected in parallel. In the track AS2 there are two first output transducers AW11, AW21 connected in parallel and two second output transducers AW12, AW22 also connected in parallel.

The parallel circuit of the first input transducers EW11, EW21 is connected to the first terminal IN+ of the input gate. The parallel circuit of the second input transducers EW12, EW22 is connected to the second terminal IN− of the input gate. The parallel circuit of the first output transducers AW11, AW21 is connected to the first terminal OUT+ of the output gate. The parallel circuit of the second output transducers AW12, AW22 is connected to the second terminal OUT− of the output gate.

The input transducer EW11 is arranged between the coupler transducers KW11 and KW12, the input transducer EW21 is arranged between the coupler transducers KW12 and KW13, the input transducer EW12 is arranged between the coupler transducers KW13 and KW14, and the input transducer EW22 is arranged between the coupler transducers KW14 and KW15. The output transducer AW11 is arranged between the coupler transducers KW21 and KW22, the output transducer AW21 is arranged between the coupler transducers KW22 and KW23, the output transducer AW12 is arranged between the coupler transducers KW23 and KW24, and the output transducer AW22 is arranged between the coupler transducers KW24 and KW25.

The electrical connection between the transducers KW11 and KW21, KW12 and KW22, KW13 and KW23, KW14 and KW24, KW15 and KW25 arranged in different tracks is indicated by dashed lines.

In consideration of the phase relationships in the coupler transducers, it is possible, as shown in FIG. 3, to conductively interconnect all of the coupler transducers within the corresponding sub-filter TF1, TF2. Here, common electrodes of the coupler transducers are connected to each other and not to ground. This wiring is possible, in particular, when the signals are nearly in-phase on the coupler paths in the passband of each sub-filter, so that there is no undesired blanking.

In the embodiment presented in FIG. 3, a parallel inductor L1, L2 is connected on the input gate and also on the output gate of the filter. The inductor L1 is arranged in a transverse branch that connects two terminals IN+, IN− of the input gate. The inductor L2 is arranged in a transverse branch that connects two terminals OUT+, OUT− of the output gate.

In the embodiment according to FIG. 3, the tracks AS1 and AS3 have the same topology. The tracks AS2 and AS4 also have the same topology. The input transducers with the same reference number arranged in the tracks AS1 and AS3 are connected in parallel. The output transducers with the same reference number arranged in the tracks AS2 and AS4 are also connected in parallel.

In the embodiment according to FIG. 4, the tracks AS1 and AS3 have a mirrored topology or transducer arrangement. The tracks AS2 and AS4 also have a mirrored topology. The axis of symmetry SA is directed perpendicular to the longitudinal axis of each track. In this case, the second sub-filter TF2 mirrors the topology of the first sub-filter TF1 with respect to the axis SA.

The paired coupler transducers that are conductively interconnected but arranged in different tracks form a transducer pair. A first transducer of the transducer pair is preferably arranged in the track facing the input, and a second transducer of the transducer pair is arranged in the track of the corresponding sub-filter facing the output.

Different transducer pairs that are arranged in the corresponding sub-filters could be operated in-phase. However, they could also be operated out-of-phase.

The embodiments with coupler transducers connected in series, see FIGS. 1, 2, and 4, are distinguished in that a phase difference of 180° between the transducer pairs is possible. Here, the phase difference of 180° between the terminals of each balanced gate could be guaranteed by the matching of the finger parity or the orientation of the transducers.

In the embodiments shown, a few of the connections of the transducers to ground are optional. It is possible for the reflectors to float or to be connected to ground. It is also possible to connect the input transducers EW11 and EW12 or also the input transducers EW21 and EW22 to each other in series by a floating, electrical connection. This also applies correspondingly to the output transducers AW11 and AW12 and to the output transducers AW21 and AW22.

In the embodiments according to FIGS. 3 and 4, the track AS2 could be generated by mirroring the track AS1 about a longitudinal axis. The track AS4 could be generated by mirroring the track AS3 about a longitudinal axis.

Structures of the resonator filter are generated on a piezoelectric substrate, e.g., $LiTaO_3$, $LiNbO_3$, quartz, or another piezoelectric substrate. The transducers have at least one layer made from Al or an aluminum alloy. In one embodiment, the layer thickness of this layer equals 230 nm.

The transfer functions of the resonator filter shown in FIG. 3 and its sub-filters are presented in FIGS. 5-8.

Figure 5:
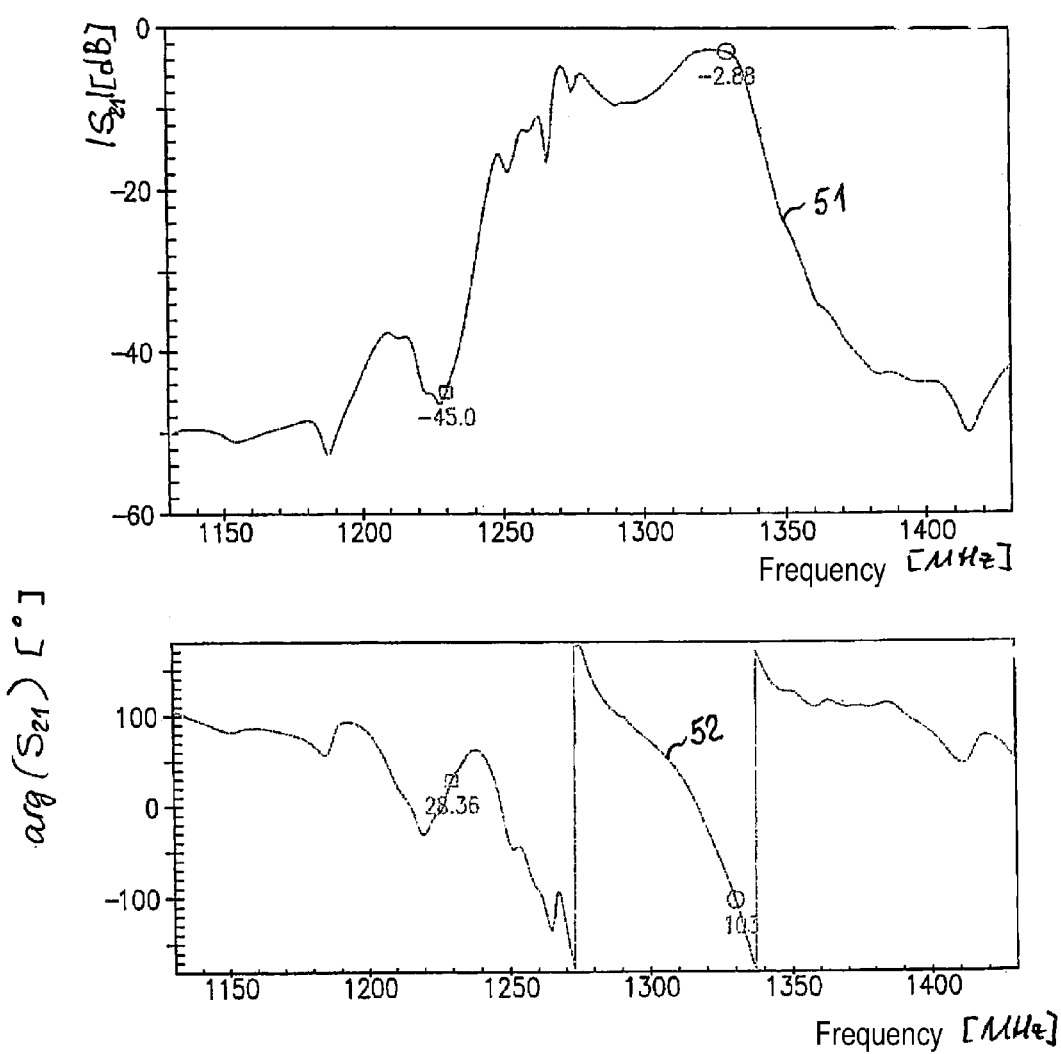
FIG. 5, shows the transfer function of the first sub-filter of the resonator filter shown in FIG. 3.
Figure 6:
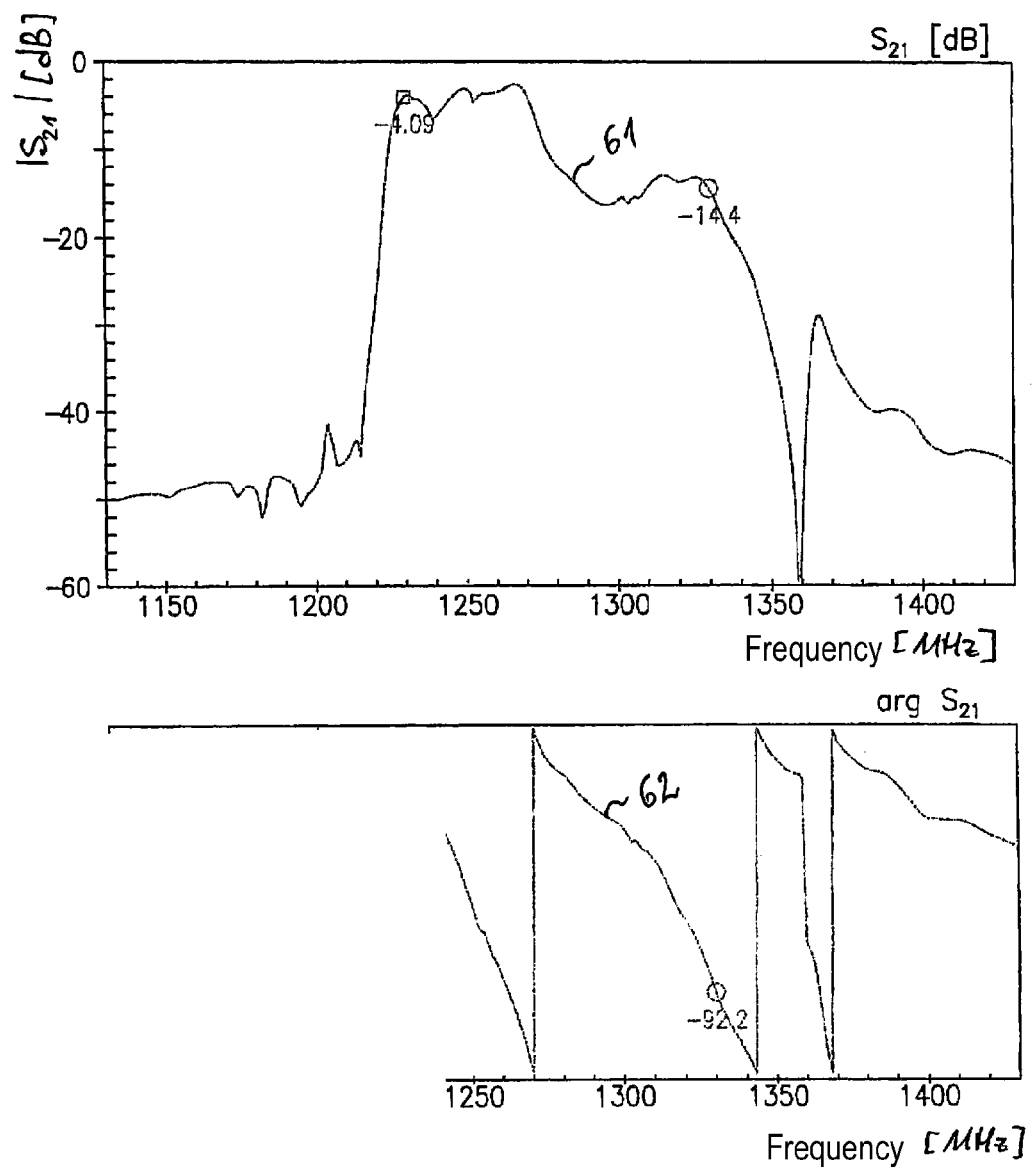
FIG. 6, shows the transfer function of the second sub-filter of the resonator filter shown in FIG. 3.

In FIG. 5, the curve 51 describes the magnitude of the transfer function $S_{21}$ and the curve 52 describes the phase response of the transfer function $S_{21}$ of the first sub-filter. In FIG. 6, the curve 61 describes the magnitude of the transfer function $S_{21}$ and the curve 62 describes the phase response of the transfer function $S_{21}$ of the second sub-filter.

Figure 7:
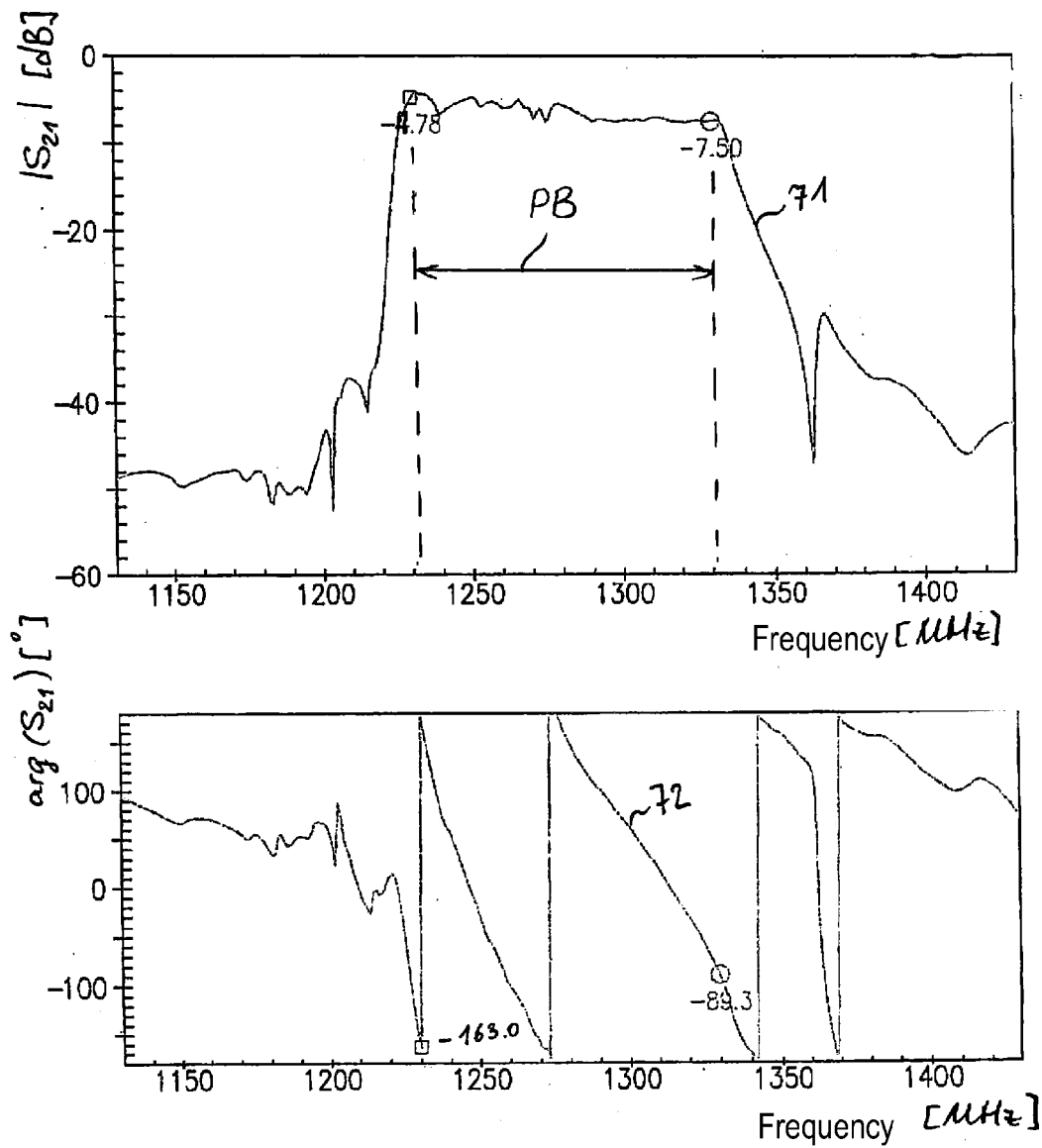
FIG. 7, shows the transfer function of the resonator filter shown in FIG. 3.
Figure 8:
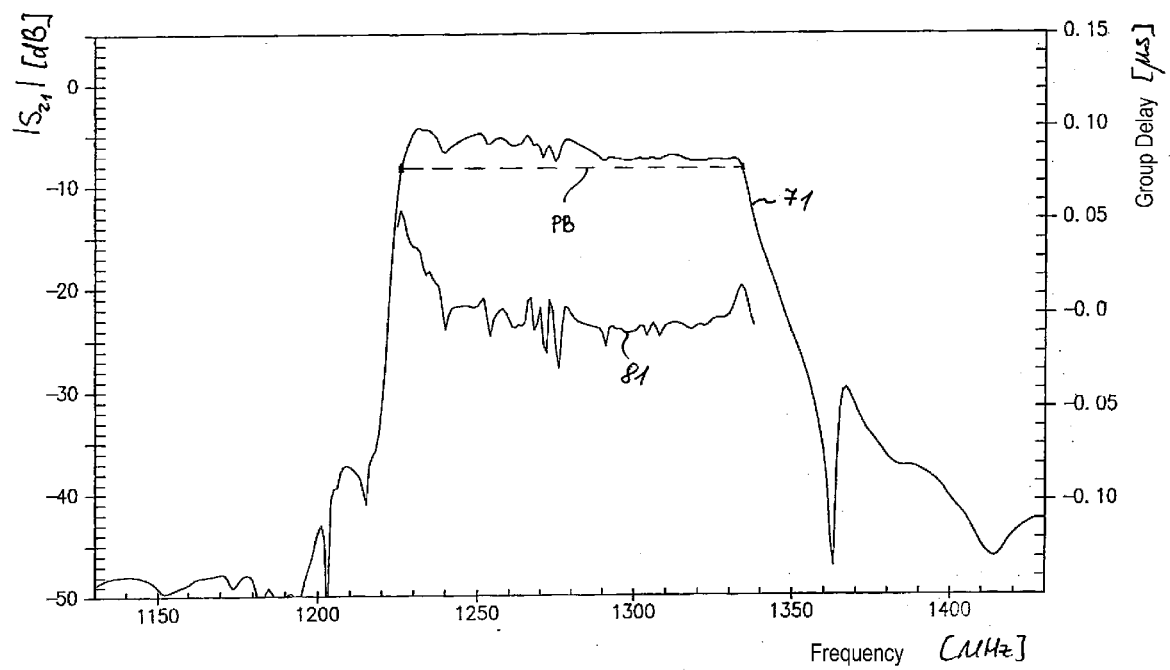
FIG. 8, shows the transfer function and the frequency response of the group delay time of the resonator filter shown in FIG. 3 in the passband.

In FIGS. 7 and 8, the curve 71 describes the magnitude of the transfer function $S_{21}$, the curve 72 describes the phase response of the transfer function $S_{21}$, and the curve 81 describes the frequency response of the group delay time for the resonator filter that comprises the first and second sub-filters.

The boundaries of the passband PB of the resonator filter, as well as the values that are assumed by the transfer function $|S_{21}|$ or $\arg\{S_{21}\}$ at these frequencies, are indicated in the figures. The lower boundary lies approximately at 1230 MHz, the center of the passband at 1280 MHz, and the upper boundary approximately at 1330 MHz. The width of the passband PB at −4 dB equals 107.9 MHz.

The passband of the first sub-filter TF1 lies in the higher frequency range of the passband PB, (see FIG. 5). At the lower boundary of the passband, the attenuation equals up to 45 dB.

From FIG. 5 it is clear that, in the first sub-filter TF1, the phase cycle from the center up to the upper boundary of the passband, i.e., between 1280 MHz and 1330 MHz, equals approximately 230° (from +130° to −103°).

The passband of the second sub-filter TF2 lies in the low-frequency region of the passband PB, see FIG. 6. In the passband above the passband center, the attenuation equals up to 16 dB.

From FIG. 6 it is clear that in the second sub-filter TF2, the phase cycle from the lower boundary up to the center of the passband, i.e., between 1230 MHz and 1280 MHz, equals approximately 430° (from +201° to −230°).

For the entire resonator filter, a phase cycle of approximately 646° is produced within the passband PB, see FIG. 7.

From FIG. 8 it is clear that the amplitude of the ripple of the group delay time above the frequency in the region of the center of the passband PB does not exceed a level of 40 ns. The bandwidth of the filter with respect to the center of the passband at −4 dB equals 8.4%.

Figure 9:
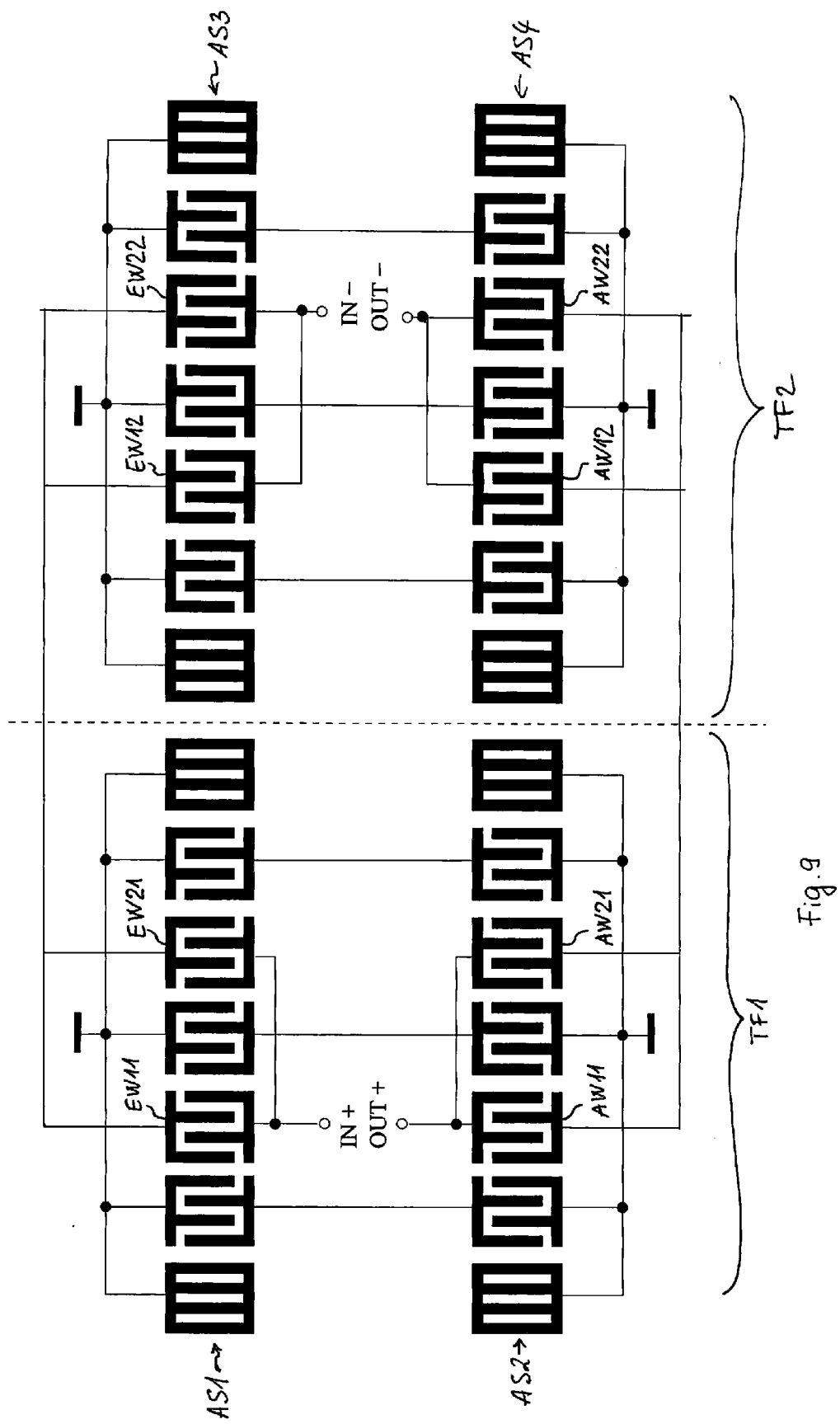
FIG. 9, shows one embodiment of the resonator filter in which first and second input transducers or output transducers are connected in series.
Figure 10:
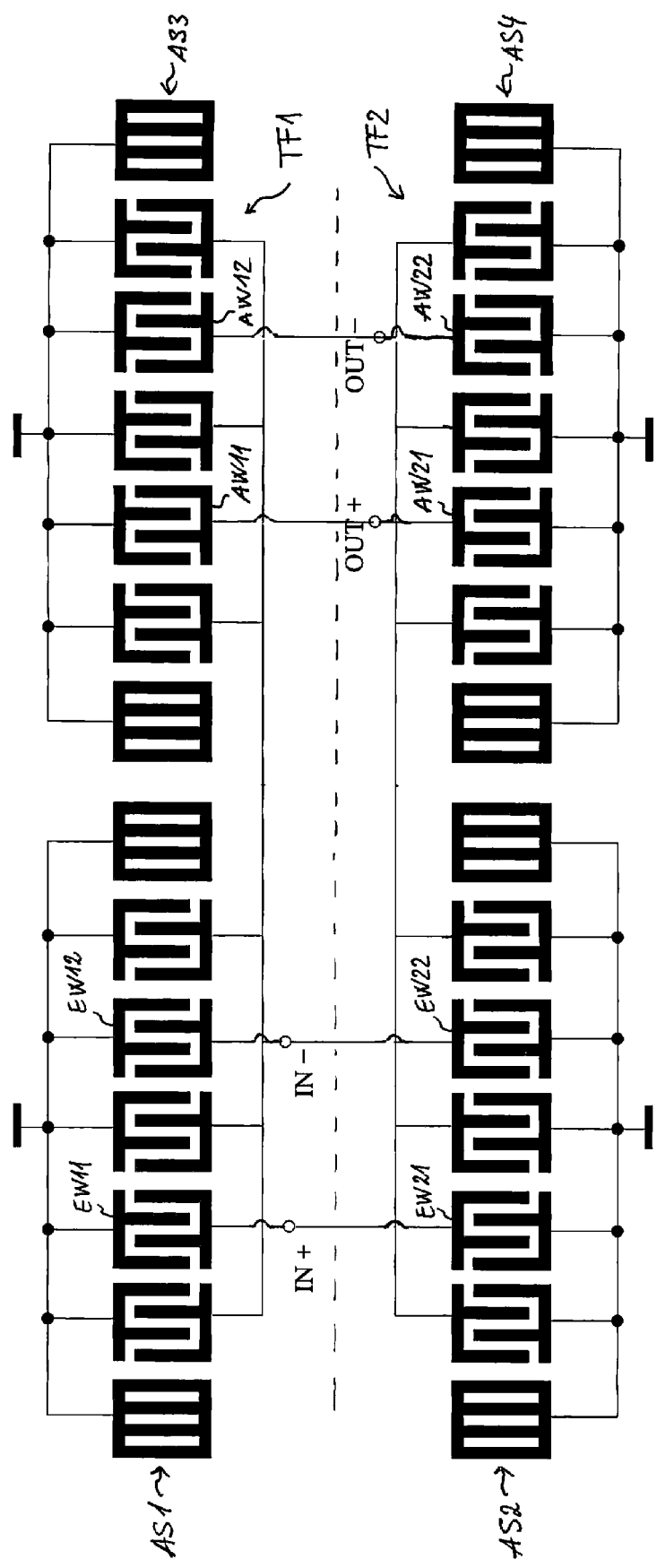
FIG. 10, shows one embodiment of the resonator filter in which the input-side track and the output-side track of each sub-filter are arranged one next to the other.
Figure 11:
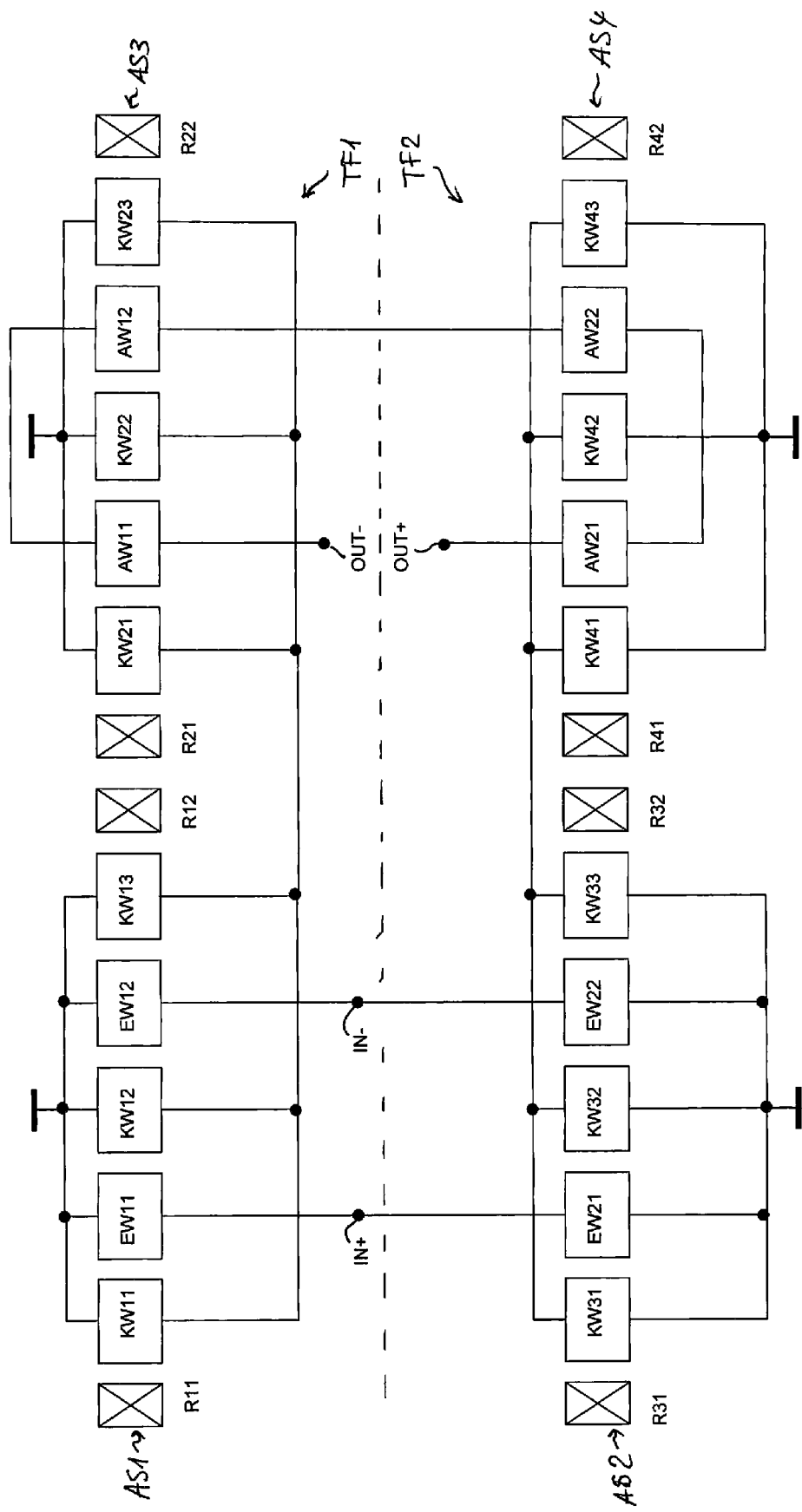
FIG. 11, shows one embodiment of the resonator filter with a series circuit of the output transducer.

In FIGS. 9, 10, and 11, additional embodiments of the resonator filter are presented.

In FIG. 9, the first input transducers EW11, EW21 are arranged in a common track AS1 of the first sub-filter TF1 and connected in parallel. The second input transducers EW12, EW22 are arranged in a common track AS3 of the second sub-filter TF2 and connected in parallel. The parallel circuit of the first input transducers EW11, EW21 is connected in series with the parallel circuit of the second input transducers EW12, EW22 and arranged between the terminals IN+, IN− of the input gate.

The first output transducers AW11, AW21 are here arranged in a common track AS2 of the first sub-filter TF1 and connected in parallel. The second output transducers AW12, AW22 are arranged in a common track AS4 of the second sub-filter TF2 and connected in parallel. The parallel circuit of the first output transducers AW11, AW21 is connected in series with the parallel circuit of the second output transducers AW12, AW22 and arranged between the terminals OUT+, OUT− of the output gate.

In FIG. 9, the sub-filters TF1, TF2 are connected in series. The parallel-connected input transducers EW11 and EW21 of the first sub-filter TF1 connected in parallel are connected in series with the parallel-connected input transducers EW12 and EW22 of the second sub-filter TF2 connected in parallel and thereby form, together, a balanced input. This also applies in a corresponding way to the output.

In FIGS. 10, 11, an embodiment of the resonator filter is shown in which the tracks AS1, AS3 of the first sub-filter TF1 are arranged one next to the other. The tracks AS2, AS4 of the second sub-filter TF2 are also arranged adjacent one another. The coupler transducers of the tracks AS1 and AS3 are connected in parallel. The coupler transducers of the tracks AS2 and AS4 are connected in parallel.

The position of the tracks AS1, AS2, AS3, AS4 on the substrate can be, in principle, arbitrary. For example, from the arrangement shown in FIG. 3, if the tracks AS2 and AS3 are interchanged, one essentially obtains the arrangement according to FIG. 10. This applies especially to the topology of the arrangement.

In the embodiment of the resonator filter shown in FIG. 11, the first output transducers AW11, AW12 are arranged in the second track AS3 of the first sub-filter TF1 and the second output transducers AW21, AW22 are arranged in the second track AS4 of the second sub-filter TF2. The first output transducers AW11, AW12 are connected in series. The second output transducers AW21, AW22 are connected in series. The series circuit of the transducers AW11, AW12 is connected in series with the series circuit of the transducers AW21, AW22 and arranged between the terminals OUT+, OUT− of the output gate. This connection embodiment is also possible on the side of the input gate. Here, input transducers EW11, EW21, EW12, EW22 connected one behind the other are arranged between the terminals IN+, IN− of the input gate.

Figure 12:
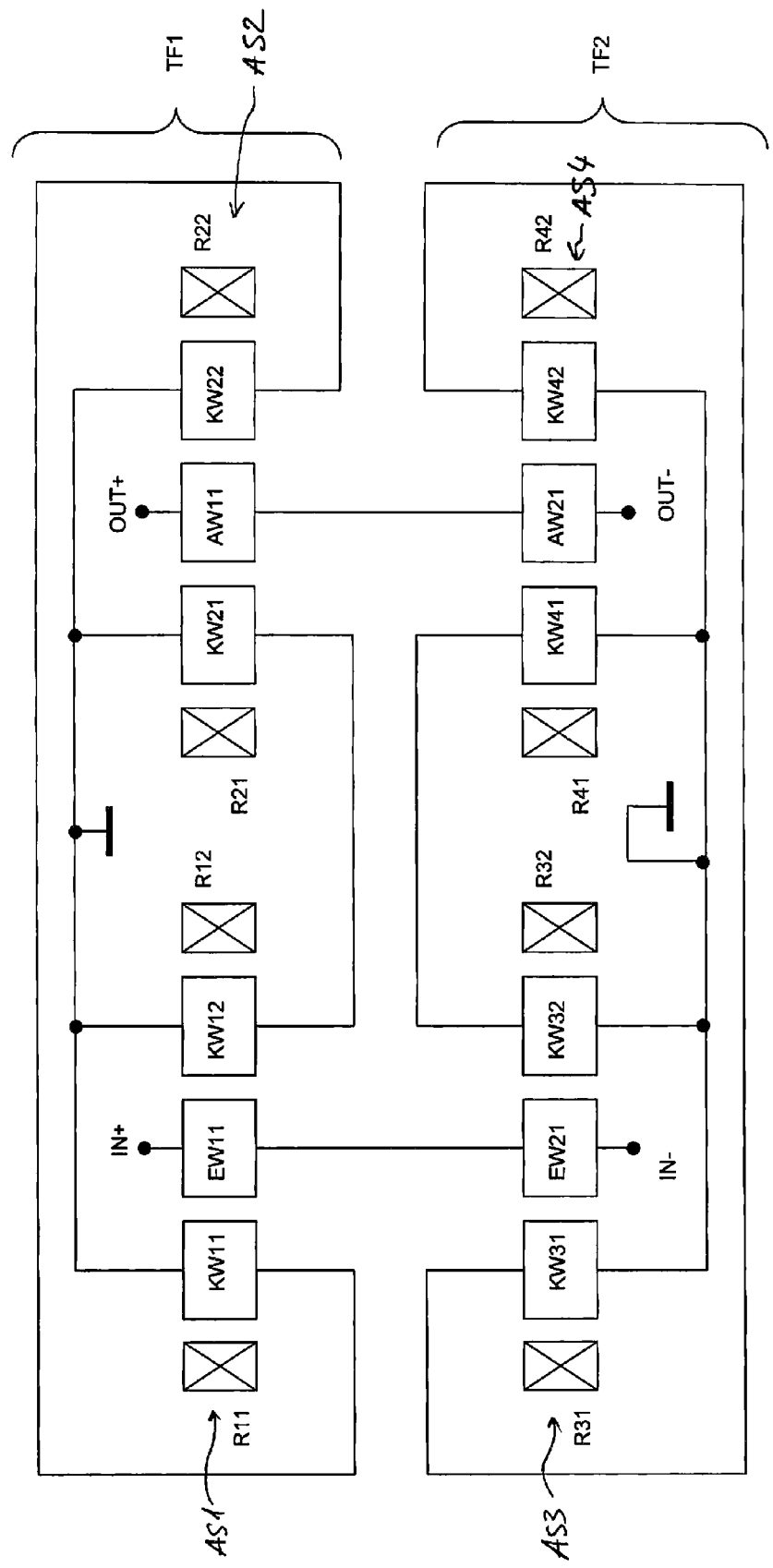
FIG. 12, shows one embodiment of the resonator filter with a series circuit of the input transducers and a series circuit of the output transducers.

In FIG. 12, an embodiment is shown in which three transducers are arranged in each track instead of five. This is a very favorable embodiment with respect to layout, because all of the connections can be produced on the chip without crossing.

In FIG. 12, the input and output transducers are each connected in series and form a balanced input IN+, IN− and output OUT+, OUT−, respectively.

In one embodiment, one and the same track or at least one common transducer can be assigned to the two sub-filters.

Figure 13:
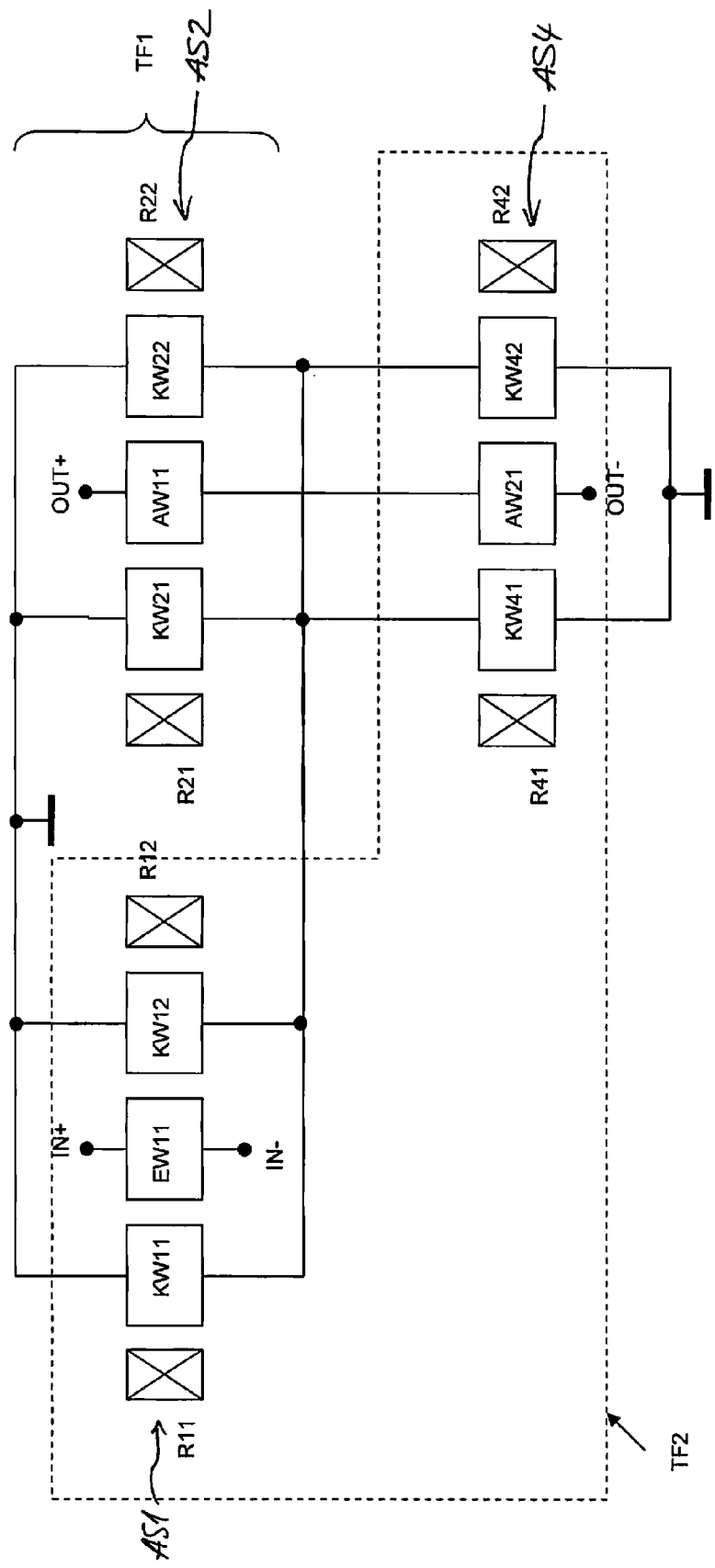
FIG. 13, shows one embodiment of the resonator filter with two sub-filters that have a common input transducer and that are realized in three acoustic tracks.

In the embodiment according to FIG. 13, an input track AS3 is omitted and the remaining input track AS1 is used in common for both sub-filters TF1 and TF2. The input transducers EW11 is here connected between the terminals IN+, IN− of the input gate.

The first sub-filter TF1 has, in this case, the tracks AS1 and AS2. The second sub-filter TF2 has the tracks AS1 and AS4. The transducers EW11, KW11, KW12 are assigned to the two sub-filters.

Figure 14:
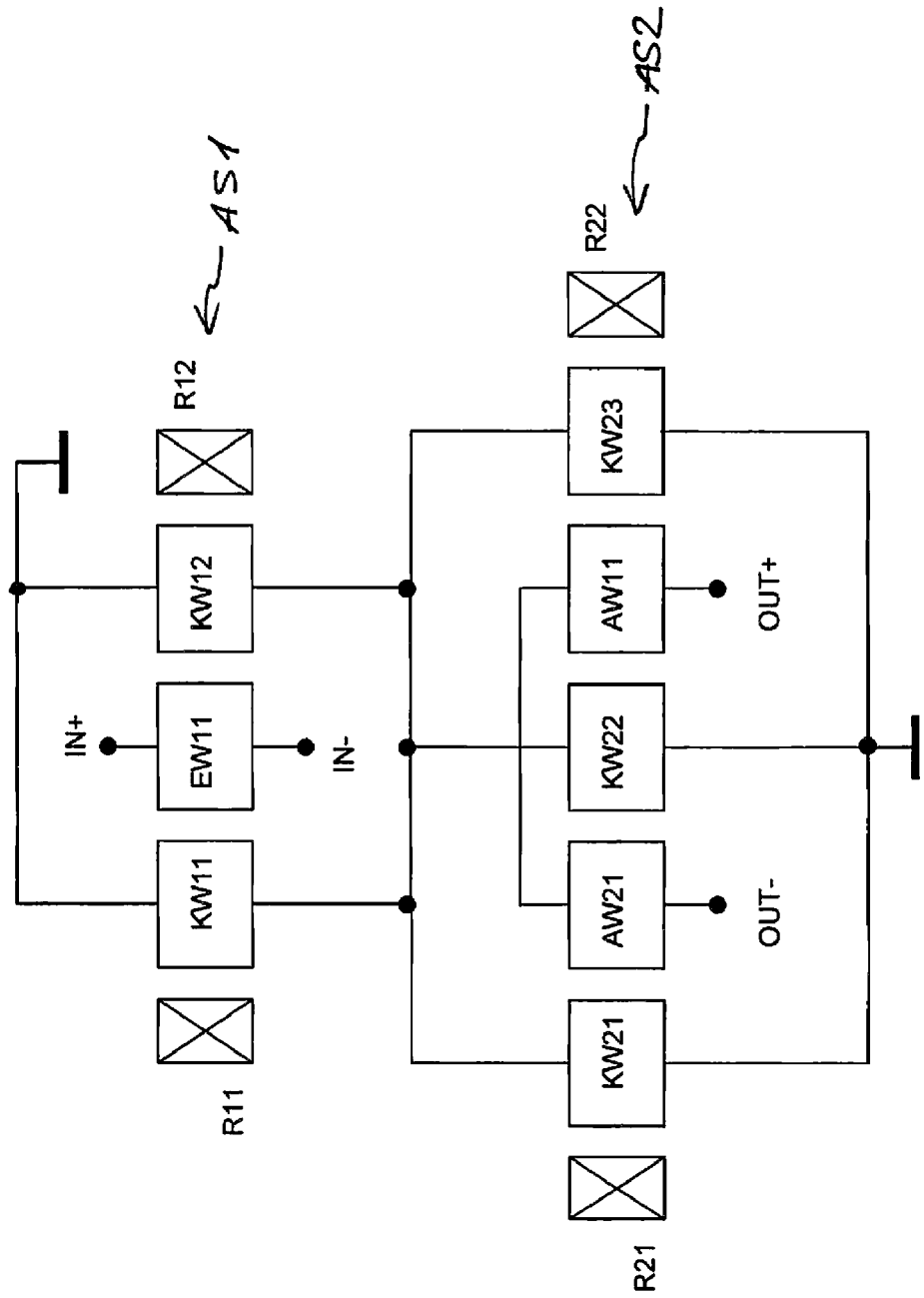
FIG. 14, shows one embodiment of the resonator filter with two sub-filters that are realized in two acoustic tracks.

In the embodiment according to FIG. 14, the two output tracks are also combined into one track AS2. The transducers EW11, KW11, KW12, KW21, KW22, and AW21 are assigned, for example, to the first sub-filter TF1 and the transducers EW11, KW11, KW12, KW22, KW23, and AW11 are assigned to the second sub-filter TF2. The sub-filters TF1, TF2 have common transducers EW11, KW11, KW12, KW22.

Figure 15:
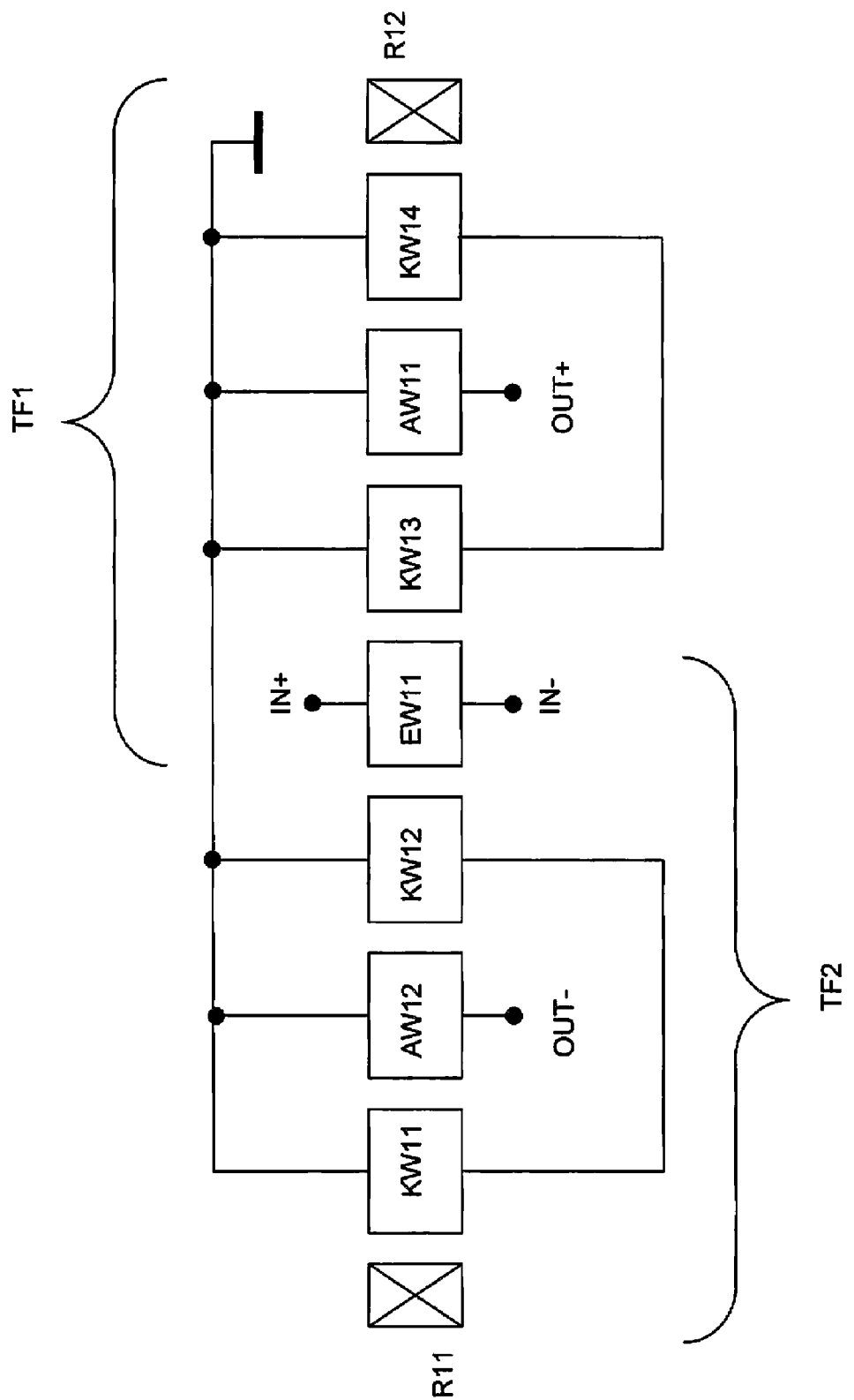
FIG. 15, shows one embodiment of the resonator filter with two sub-filters that are realized in one acoustic track.

The embodiment according to FIG. 15 shows an embodiment in which both sub-filters TF1, TF2 are realized in a single track. One part of this track that comprises the transducers KW11, AW12, KW12, and EW11 is assigned to the second sub-filter TF2, and one part of this track that comprises the transducers EW11, KW13, AW11, and KW14 is assigned to the first sub-filter TF1.

This embodiment can be derived, in principle, from FIG. 13 in that the two output tracks are each placed to the left and right of the input track and then combined into a common track.

The ground connection of the output transducers AW11, AW12 in FIG. 15 is optional. They could also be connected by a floating track conductor as in FIG. 14.

In contrast to the preceding figures, in FIGS. 13 to 15, only one input transducer EW11 is arranged between the terminals IN+, IN− of the input gate. In this case, this is a common terminal transducer for both sub-filters TF1, TF2.

The embodiments according to FIGS. 13, 14, and 15 are particularly well suited to the realization of the filter with an integrated balanced/unbalanced transformer function. Here, for example, the terminal IN− is connected to ground.

The possible implementations of the resonator filter emerge from the embodiments shown in the figures. In all of the embodiments, the connection of the input transducers and/or the output transducers to ground could be eliminated.

All of the individual tracks could be combined together with other tracks into one common acoustic track. For at least two or more input or output transducers, these could be connected both in series and in parallel. For more than three input or output transducers, a combination of series and parallel circuits of the transducers is also possible.

All of the embodiments could be operated in a balanced or unbalanced mode. A balanced input or output could be replaced in all of the embodiments with an unbalanced input or output, in that, e.g., the terminal IN− or OUT− is connected to ground. Thus, a balanced/unbalanced transformer function is also possible for all embodiments.

There is no restriction with respect to the number of elements or connection possibilities shown.

What is claimed is:

1. A filter working with surface acoustic waves and constructed as a resonator filter, the filter comprising:
    a first sub-filter; and
    a second sub-filter interconnected with the first sub-filter;
    wherein the filter has a transfer function with a phase rotation of at least 400° within a passband;
    wherein the first and second sub-filters both have a passband that is narrower than a passband, of the resonator filter;
    wherein the first and second sub-filters each, have at least three or more terminal transducers, and wherein the three or more terminal transducers comprise at least one input transducer and at least two output transducers, or wherein the three or more terminal transducers comprise at least two input transducers and at least one output transducer;
    wherein each sub-filter is divided into first and second acoustic tracks;
    wherein the terminal transducers of the at least three or more terminal transducers located in each first track are input transducers;
    wherein the terminal transducers of the at least three or more terminal transducers located in each second track are output transducers;
    wherein each terminal transducer of the first and second tracks are arranged between two coupler transducers; and
    wherein the first and the second tracks are electrically connected in series by connecting corresponding coupler transducers.

2. The filter according to claim 1, wherein the transfer function has a phase rotation of at least 540° within the passband.

3. The filter according to claim 1,
    wherein the filter has an unbalanced input gate and an unbalanced output gate, or
    wherein the filter has an unbalanced input gate and a balanced output gate, or
    wherein the filter has a balanced input gate and an unbalanced output gate.

4. The filter according to claim 1, wherein the filter has a balanced input gate and a balanced output gate.

5. The filter according to claim 1,
    wherein the three or more terminal transducers of the first and second sub-filters comprise at least one first input transducer and at least one second input transducer conductively connected to the at least one first input transducer, and
    wherein, the at least one first input transducer is arranged in the first sub-filter and the at least one second input transducer is arranged in the second sub-filter.

6. The filter according to claim 5, wherein the first and second sub-filters are connected in parallel, wherein corresponding first acoustic tracks are connected by an electrical parallel circuit of the at least one first and at least one second input transducers and corresponding second acoustic tracks are connected by an electrical parallel circuit of at least one first and at least one second output transducers of the three or more terminal transducers of the first and second sub-filters.

7. The filter according to claim 5, wherein the at least one first input transducer is electrically connected, in series with the at least one second input transducer.

8. The filter according to claim 1, wherein the passbands of the first and second sub-filters are spaced apart from each other.

9. The filter according to claim 1,
    wherein the three or more terminal transducers of the first and second sub-filters comprise at least one first output transducer and at least one second output transducer conductively connected to the at least one first output transducer, and
    wherein the at least one first output transducer is arranged in the first sub-filter and the at least one second output transducer is arranged in the second sub-filter.

10. The filter according to claim 9, wherein the at least one first output transducer is electrically connected in parallel to the at least one second output transducer.

11. The filter according to claim 9, wherein the at least one first output transducer is electrically connected in series with the at least one second output transducer.

12. The filter according to claim 1, wherein both sub-filters have the same phase angle in at least one frequency range.

13. The filter according to claim 1,
    wherein the three or more transducers of the first sub-filter comprise at least two first input transducers that are conductively interconnected, and/or wherein the three or more transducers of the second sub-filter comprise at least two second input transducers conductively interconnected, and/or wherein the three or more transducers of the first sub-filter comprise at least two first output transducers conductively interconnected, and/or wherein the three or more transducers of the second sub-filter comprise at least two second output transducers conductively interconnected.

14. The filter according to claim 13,
wherein the at least two first input transducers are electrically interconnected in parallel, or
wherein the at least two first input transducers are electrically interconnected in series.

15. The filter according to claim 13,
wherein the at least two second input transducers are electrically interconnected in parallel, or
wherein the at least two second input transducers are electrically interconnected in series.

16. The filter according to claim 13,
wherein the at least two first output transducers are electrically interconnected in parallel, or
wherein the at least two first output transducers are electrically interconnected in series.

17. The filter according to claim 13,
wherein the at least two second output transducers are electrically interconnected in parallel, or
wherein the at least two second output transducers are electrically interconnected in series.

18. The filter according to claim 1, wherein at least one stop band of the first and/or second sub-filter lies in the passband of the resonator filter.

19. The filter according to claim 1, wherein at least one terminal transducer and at least two coupler transducers are arranged in each acoustic track.

20. The filter according to claim 19, wherein at least two terminal transducers and at least three coupler transducers are arranged in each acoustic track.

21. The filter according to claim 1, wherein the first sub-filter and the second sub-filter are operated in-phase.

22. The filter according to claim 1, wherein the passband of the first sub-filter lies at least partially outside of the passband of the second sub-filter.

23. The filter according to claim 1,
wherein each sub-filter has an input-side track which is the first acoustic track and an output-side track which is the second acoustic track conductively connected to input-side track by means of coupler transducers, and
wherein at least one input transducer is arranged in each input-side track and at least one output transducer is arranged in each output-side track.

24. The filter according to claim 23,
wherein the input-side tracks of the first and the second sub-filter are configured essentially identically at least with respect to a phase angle of the corresponding transducers, and/or
wherein the output-side tracks of the first and the second sub-filter are configured essentially identically at least with respect to the phase angle of the corresponding transducers.

25. The filter according to claim 23,
wherein the input-side track of the second sub-filter is configured essentially mirror-symmetric to the input-side track if of the first sub-filter, and/or
wherein the output-side track of the second sub-filter is configured essentially mirror-symmetric to the output-side track of the first sub-filter.

* * * * *